United States Patent
Vityaev (12) 
(10) Patent No.: US 6,427,220 B1
(45) Date of Patent: Jul. 30, 2002

(54) METHOD AND APPARATUS FOR PRML DETECTION INCORPORATING A CYCLIC CODE

(75) Inventor: Andrei E. Vityaev, Santa Clara, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/434,207

(22) Filed: Nov. 4, 1999

(51) Int. Cl.[7] .............................................. H03M 13/00
(52) U.S. Cl. ....................... 714/781; 708/580
(58) Field of Search ................................ 714/781, 758, 714/795, 782, 783, 784, 785, 786; 708/530, 420, 421

(56) References Cited

U.S. PATENT DOCUMENTS

| | | | | |
|---|---|---|---|---|
| 5,491,701 A | * | 2/1996 | Zook | 714/762 |
| 5,923,679 A | * | 7/1999 | Itoh et al. | 370/317 |
| 5,946,328 A | * | 8/1999 | Cox et al. | 714/784 |

OTHER PUBLICATIONS

Thomas Conway, "A New Target Response with Parity Code for High Density Magnetic Recording Channels", *IEEE Transactions on Magnetics*, vol. 34, No. 4, Jul. 1998, pp. 2382–2386.

Hideki Sawaguchi et al., "Iterative Decoding for Concatenated Error Correction Coding in PRML Channel Systems", *Global Telecommunications Conf., Globecom'99*, General Conference Part B, May 1999, pp. 749–754.

Hideki Sawaguchi et al., "Soft-Output Decoding for Concatenated Error Correction in High-Order PRML Channels", *IEEE International Conference on Communications*, Jun. 9, 1999, Paper No. S41.3.

R. Blahut, "Theory and Practice of Error Control Codes." Addison–Wesley, 1984, Chapter 5, pp. 93–129.

R. Blahut, "Fast Algorithms for Digital Signal Processing", Addison–Wesley, 1985, Chapter 12, pp. 387–405.

T. Conway "A New Target Response with Parity Coding for High Denisity Magnetic Recording Channels", IEEE Transactions on Magnetics, vol. 34, No. 4, Jul. 1998, pp. 2382–2386.

S. McLaughlin, P. Lee., R. Cloke "Codes for Improved Timing Recovery in PR4 and EPR4 Magnetic Recording", Proceedings of the Global Conference on Communications, Phoenix, AZ, 1997 (IEEE) pp. 1235–1239.

R. Karabed, N. Nazari "Analysis of Error Sequences for PRML and EPRML Signaling Performed over Lorentzian Channel", Proceedings of the Global Conference on Communications, London, UK, 1996, (IEEE) pp. 368–373.

* cited by examiner

*Primary Examiner*—Christine T. Tu
(74) *Attorney, Agent, or Firm*—Eric B. Janofsky (57) ABSTRACT

Apparatus and method for correcting errors in data recovered from a magnetic medium includes detecting the data recovered from the read wave form, and performing an arithmetic operation such as division on the recovered data sequence to determine any non-zero remainder as an indication of an error event. The recovered data sequence is corrected in response to logical determination of a possible event error and position in the recovered data sequence from a collection of predetermined error and position for which the division of the corrected data sequence yields zero remainder.

15 Claims, 4 Drawing Sheets

METHOD AND APPARATUS FOR PRML DETECTION INCORPORATING A CYCLIC CODE

FIELD OF THE INVENTION

This invention relates to read channel technology for digital data storage systems, and more particularly to a post-processor based upon cyclic code rather than parity code.

BACKGROUND OF THE INVENTION

Figure 1:
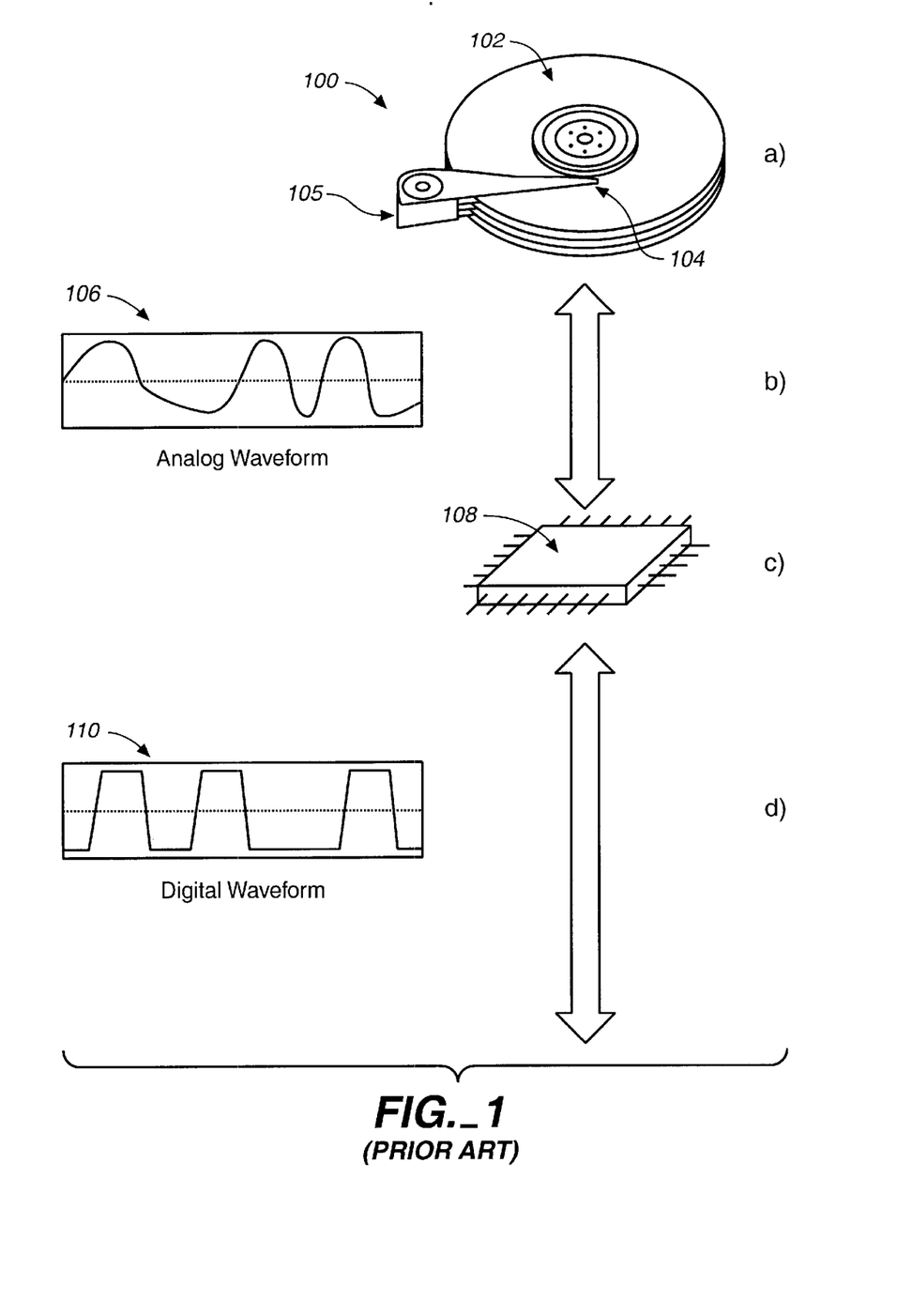
FIGS. 1a–d are, respectively, pictorial illustrations of a stack of magnetic data storage disks, operational analog waveforms on a transducer associated with a storage disk, integrated read-channel circuit chip, and digitized waveform of an analog waveform.

Digital data storage systems such as magnetic disks and associated drive apparatus commonly incorporates a so-called read channel that retrieves the accessed data from the analog waveforms provided by the read-head transducer interacting with the magnetic domains on the magnetic disk. As illustrated in FIG. 1a, this technique involves a magnetic disk and head assembly 100 including a stack of several rigid magnetic disks and several magnetic transducers positioned on a movable arm 105 for operable interaction with the magnetic recording surfaces on each disk. These magnetic heads slide or 'fly' in close proximity over the surfaces of the magnetic disks 102 to react to the changes in orientations of magnetic fields of tiny magnetic domains on the disks that represent the stored data. These interactions with magnetic fields produce electrical signals of constantly varying amplitudes that are pre-amplified to produce resulting analog waveforms 106, as shown in FIG. 1b, that are applied to a read-channel integrated circuit 108, as shown in FIG. 1c. The read channel integrated circuit 108 processes the waveform and produces data-representing signals having digital waveforms 110, as shown in FIG. 1d. The same integrated circuit 108 is also used during data-writing processes to transform user data in digital form to analog waveforms that are then recorded on a disk 102 via the associated magnetic transducer.

Figure 2:
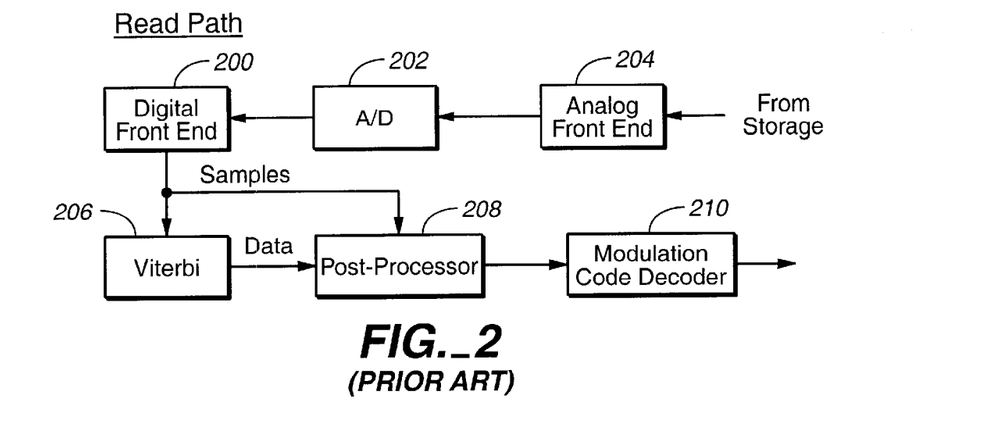
FIG. 2 is a block schematic diagram of a conventional read path of a channel circuit.
Figure 3:
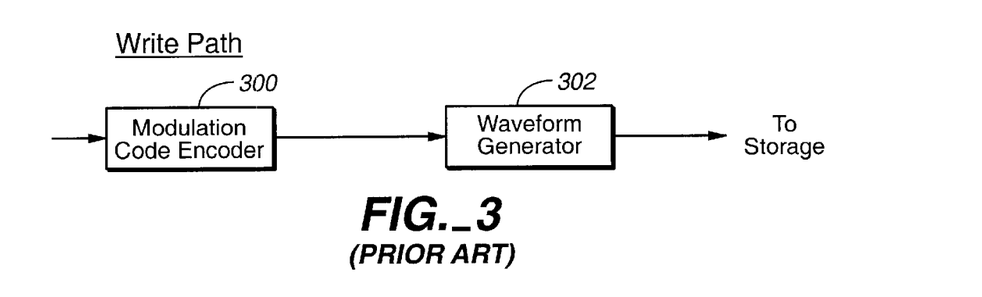
FIG. 3 is a block schematic diagram of a conventional write path of the channel circuit.

FIGS. 2 and 3 illustrate typical flow of data and signals during read and write operations. During the write operation shown in FIG. 3, the user data is first encoded using a modulation code encoder 300. The encoded data is then supplied to a waveform generator 302. During the read process, shown in FIG. 2, the data is first passed through the analog front end 204 and is then supplied to analog-to-digital converter 202. The digitized signal is then supplied to a digital front end 200 which includes digital equalization and a variety of algorithms facilitating gain and timing tracking. After passing through the digital front end, digital samples are supplied to Viterbi algorithm 206 where the user data is extracted from the input signal. The output of Viterbi algorithm, while mostly correct, typically contains a number of errors, and a post-processor 208 is therefore used to reduce the rate at which the errors occur. Then, the data is supplied to the modulation code decoder 210.

In conventional systems, the post-processor uses parity bits to check for error events. For example, given a word containing 33 bits $b_{33}, b_{32}, \ldots, b_{2,b1}$, bit $b_{34}$ is added such that:

$$b_{34}+b_{33}+b_{32}+ \ldots +b_2+b_1=0 \qquad \text{Eqn. (1)}$$

where + stands for "exclusive-or" operation. The codeword $b_{34}, b_{33}, b_{32}, \ldots, b_2, b_1$, is then recorded on the media. If, during the read process, Viterbi algorithm makes an error, for example, in $32^{nd}$ bit, producing $\bar{b}_{32}$ instead of $b_{32}$ (here $\bar{0}=1, \bar{1}=0$), then the control sum Eqn. (1) becomes equal to 1 instead of 0 which indicates that there is an error somewhere in the block of 34 bits. Post-processor uses this information to correct the error. Post-processor will also detect other error events, such as when three nearby bits are wrong, e.g. Viterbi outputs $\bar{b}_{32}, \bar{b}_{31}, \bar{b}_{30}$ instead of $b_{32}, b_{31}, b_{30}$.

SUMMARY OF THE INVENTION

In accordance with the present invention, a post-processor is formed and operated based on a cyclic code rather than on a parity code. The invention can be further understood with the following brief mathematical description of cyclic codes.

Every cyclic code is based on a generator polynomial g(x) with binary coefficients:

$$g(x)=g_0+g_1x+g_2x^2+ \ldots +g_mx^m \qquad \text{Eqn. (2)}$$

When n-m user bits $b_m, b_{m+1}, \ldots, b_{n-2}, b_{n-1}$ are sent to the cyclic code encoder, m extra bits $b_0, b_1, \ldots, b_{m-1}$ are appended at the end of the codeword. The overall code rate is hence (n-m)/n. During the encode process a division with remainder is preformed as follows. The input data bits can be thought of as a polynomial $$b_{input}(x)=b_mx^m+b_{m+1}x^{m+1}+ \ldots b_{n-2}x^{n-2}+b_{n-1}x^{n-1} \qquad \text{Eqn. (3)}$$

of degree n'11. Dividing the polynomial $b_{input}(x)$ by g(x) yields a remainder r(x):

$$b_{input}(x)=a(x)g(x)+r(x) \qquad \text{Eqn. (4)}$$

Here the division is performed modulo 2. Such division with remainder is commonly used in codes and further details can be found in the literature. The remainder r(x) is a polynomial of degree m−1:

$$r(x)=r_0+r_1x+ \ldots +r_{m-1}x^{m-1} \qquad \text{Eqn. (5)}$$

Then, setting:

$$b_j=\bar{r}_j \text{ for } j=0, 1, \ldots, m-1 \qquad \text{Eqn. (6)}$$

The result of this encoding is that the output data word $b_0, b_1, \ldots, b_{n-1}$, viewed as a polynomial $$b(x)=b_0+b_1x+ \ldots +b_{n-1}x^{n-1} \qquad \text{Eqn. (7)}$$

is divisible by generator polynomial g(x) without remainder. Hence during the error detection process, division is performed with remainder on every n-bit codeword coming out from the Viterbi algorithm and if a remainder is not equal to zero, the post-processor is activated to correct the error.

Cyclic codes are the codes which employ a generator polynomial g(x), and which in addition satisfy the requirement that polynomial $x^n+1$ is divisible by g(x) without remainder. If this requirement is satisfied then the resulting code enjoys the so-called cyclic shift property, namely that if $b_0, b_1, b_2, \ldots b_{n-1}$ is valid codeword (i.e. corresponding polynomial is divisible by g(x) without remainder) then a cyclically shifted codeword $b_1, b_2, \ldots, b_{n-1}, b_0$ is also a valid codeword.

The reason why the cyclic property is important is because if an error event (e.g., Viterbi algorithm produces $\bar{b}_{32}, \bar{b}_{31}, \bar{b}_{30}$ instead of $b_{32}, b_{31}, b_{30}$) is detected (i.e. the remainder becomes non-zero as a result of error event) then a shifted error event (e.g. Viterbi outputs $\bar{b}_7, \bar{b}_6, \bar{b}_5$ instead of $b_7, b_6, b_5$) is detected as well, as described below in greater detail.

It should also be noted that the cyclic code redundancy bits do not necessarily have to be inserted at the end of the codeword as it was in the mathematical description above. Redundancy bits can be inserted in the middle of the codeword or can even be scattered throughout the codeword and still achieve the property that the resulting codeword polynomial Eqn. (1) is divisible by generator polynomial g(x) and the cyclic property is intact.

Figure 5:
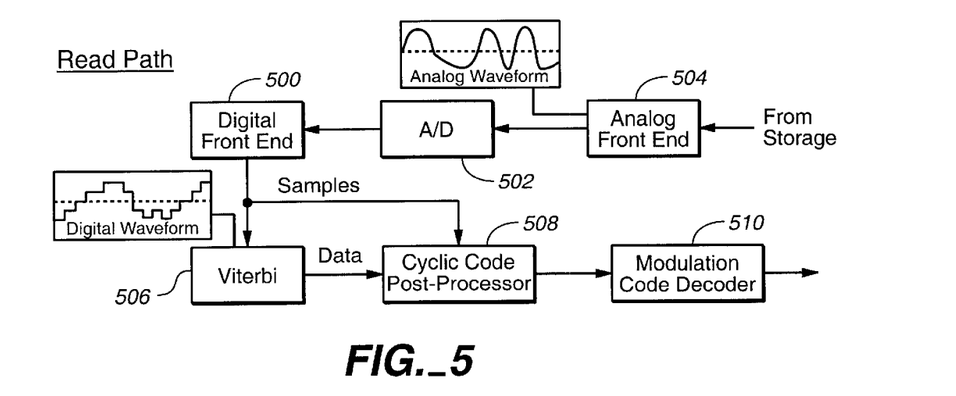
FIG. 5 is a block schematic diagram of an embodiment of the overall architecture of a read path of a channel circuit according to the present invention.
Figure 6:
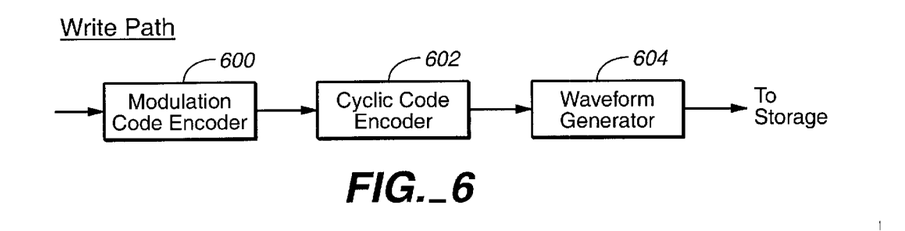
FIG. 6 is a block schematic diagram of an embodiment of the overall architecture of a write path of a channel circuit according to the present invention.

When the cyclic code post-processor is used, according to the present invention, the read path, for example, as shown in FIG. 2, is modified to incorporate a cyclic code post-processor as shown on FIG. 5 with a cyclic code post-processor substituted for the post processor (parity type) 208 of FIG. 2. The write path in FIG. 3 is modified to incorporate a cyclic code encoder, as shown in FIG. 6. Modulation code encoder 600 produces an output that is applied to the cyclic code encoder 602 where the cyclic redundancy bits are calculated and inserted into the codeword. The output of encoder 602 is then supplied to the waveform generator 604.

DESCRIPTION OF THE INVENTION

With reference to the write path of a channel illustrated in FIG. 6, operation is similar to operations as previously described with reference to the conventional write path of the conventional channel of FIG. 3, with specific distinction in the operation of the cyclic code encoder according to the following description. Incoming data in digital form is first encoded in the modulation code encoder 600 using a modulation code such as, for example, a rate 64/65 Run-Length Limited (RLL) code such as is commonly reported in the literature. The RLL-encoded data is then precoded with a transfer function:

$$\frac{1}{1 \oplus D^2} \qquad \text{Eqn. (8)}$$

meaning that precoded bits $b_i$ are computed from un-precoded bits $u_i$ according to the equation $b_i = u_i + b_{i-2}$ where + represents modulo 2.

The precoded data is then supplied, in blocks of 65 bits, to the cyclic code encoder 602. The remainder is computed using a generator polynomial $$g(x) = 1 + x + x^2 + x^4 \qquad \text{Eqn. (9)}$$

Denoting the input bit by $b_4, b_5, b_6, \ldots, b_{68}$, then the mathematical equation for the remainder is given by $$b_{input}(x) = a(x)g(x) + r_0 + r_1 x + r_2 x^2 + r_3 x^3 \qquad \text{Eqn. (10)}$$

where polynomial $b_{input}(x)$ is given by $$b_{input}(x) = b_4 x^4 + b_5 x^5 + b_6 x^6 + \ldots + b_{68} x^{68} \qquad \text{Eqn. (11)}$$

and where $r_0, r_1, r_2, r_3$ are the remainder bits. The encoder then appends redundancy bits $$b_0 = \bar{r}_0, \ b_1 = \bar{r}_1, \ b_2 = \bar{r}_2, \ b_3 = \bar{r}_3$$

at the end of the codeword.

Efficient implementations of the process of calculating the remainder bits in Equation (10) are described in the literature.

It should be noted that the generator polynomial $g(x) = 1 + x + x^2 + x^4$ does not divide polynomial $x^{69} + 1$ without remainder and hence the resulting 65/69 code is not cyclic. However, by appending an extra bit $b_{69}$, which is always set to zero, to the sequence of data, then the resulting 66/70 code is cyclic because $g(x)$ divides $x^{70} + 1$ without remainder. Since adding $b_{69} x^{69} = 0$ does not change the remainder bits in Equation (10), the bit $b_{69}$ does not have to be actually added in hardware and can remain a mathematical abstraction. The 65/69 code is therefore an example of a "shortened cyclic code", where "shortened" refers to the fact that virtual zero(s) need to be added for the code to enjoy the cyclic shift property, as described above.

One way to analyze the performance of Read-Channel integrated circuit chip 108 is by looking at responses to error events. The following mathematical discussion explains the determination of which error events are detected and which are not, thus facilitating design of the post-processor circuit architecture.

Consider that codeword $b_0, b_1, \ldots, b_{68}$ was recorded on the media and that codeword $b'_0, b'_1, \ldots, b'_{68}$ was produced by the Viterbi algorithm. The difference between the two, if not equal to all zeros, is commonly referred to as an error event. It is known, for example, that at high user bit density the most common error event is $(+1,-1,+1)$ meaning that:

$$b'_0 - b_0 = 0 \qquad \text{Eqn. (12)}$$
$$b'_1 - b_1 = 0$$
$$\ldots$$
$$b'_{j-1} - b_{j-1} = 0$$
$$b'_j - b_j = +1$$
$$b'_{j+1} - b_{j+1} = -1$$
$$b'_{j+2} - b_{j+2} = +1$$
$$b'_{j+3} - b_{j+3} = 0$$
$$\ldots$$
$$b'_{68} - b_{68} = 0$$

for some j. It is easy to see that adding a single parity bit to a codeword will catch error events $(+1,-1,+1)$ and $(+1)$ but will not catch $(+1,-1)$. Hence the performance of the corresponding read-channel circuit, having a read path, for example as shown on FIG. 2, will be dominated by the error event $(+1,-1)$. Similar analysis can be performed for codes containing two, three, etc. parity bits.

In order to determine if an error event $(+1,-1,+1)$ is detected in the cyclic code with $g(x)=1+x+x^2+x^4$, note that the remainder of $b'(x)$ is equal to the remainder of $b'(x)-b(x)$. The difference $b'(x)-b(x)$ can be written, modulo 2, as $$b'(x)-b(x)=x^j+x^{j+1}+x^{j+2} \qquad \text{Eqn. (13)}$$

Due to the cyclic shift property, the remainder of Equation (13) is equal to zero if and only if the remainder of its shifted version $$v(x)=1+x+x^2 \qquad \text{Eqn. (14)}$$

is equal to zero. However the remainder of v(x) when divided by g(x) is equal to v(x) and therefore is not zero. Therefore the error event (+1,−1,+1) is detected by the cyclic code regardless of where it occurs in the codeword.

Listed below in Table 1 are 12 most frequent error events occurring in the output of the Viterbi algorithm for low user bit density magnetic recording channel:

TABLE 1

| Event 1: | +1 |
| Event 2: | +1,−1,+1 |
| Event 3: | +1,−1 |
| Event 4: | +1,−1,+1,−1,+1 |
| Event 5: | +1,−1,+1,−1 |
| Event 6: | +1,0,0,+1 |
| Event 7: | +1,−1,+1,−1,+1,−1 |
| Event 8: | +1,0,+1 |
| Event 9: | +1,−1,+1,−1,+1,−1,+1 |
| Event 10: | +1,0,+1,0,+1 |
| Event 11: | +1,−1,+1,0,0,+1 |
| Event 12: | +1,0,0,+1,−1,+1 |

It should be noted that every event in the table represents in fact two events: itself and its negative. For example event 2 could be (+1,−1,+1) or it could be (−1,+1,−1). The generator polynomial $g(x)=1+x+x^2+x^4$ will catch Events 1 through 11 but will not catch Event 12. Hence for this shortened cyclic code the post-processor should be designed to correct the first 11 events in the table.

Figure 4:
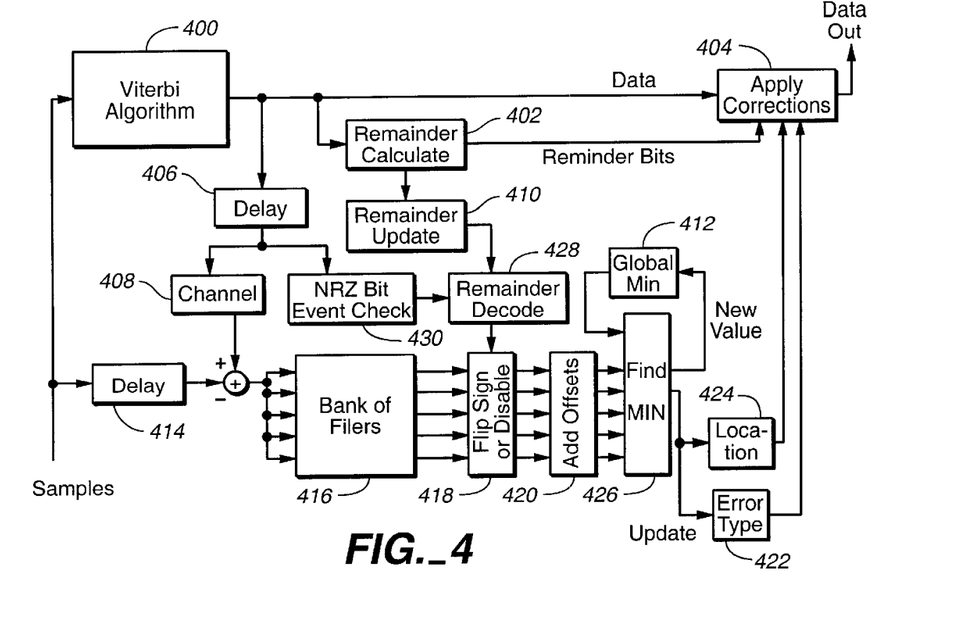
FIG. 4 is a block schematic diagram of the overall architecture of one embodiment of a post processor according to the present invention.

The overall system architecture incorporating the cyclic code post-processor according to the present invention is shown on FIG. 5, as previously discussed herein, and the architecture of the post-processor 508 is shown on FIG. 4. Input samples are first applied to the Viterbi algorithm 400. The output of the Viterbi algorithm is applied to circuitry 402 which performs remainder calculation in accordance with the mathematical Equation (10).

If the remainder bits are not all equal to zero, the post-processor will then try to correct the error according to the following strategy. For every bit location j=0, . . . , 68 it uses the remainder and Viterbi output to determine which error events (1 through 11) could have occurred starting from the bit $b_j$. Then it assigns a measure of likelihood, called Maximum Likelihood Distance Penalty (MLDP), to every feasible error event. The post-processor chooses the event with the smallest MLDP among all feasible events for all starting positions.

To describe this strategy in further details, reference is made to FIG. 4. To describe this process, consider an example when j=0, when the Viterbi output bits are:

$$b_0=1,\ b_1=0,\ b_2=0,\ b_3=1,\ b_4=1,\ b_5=0,\ b_6=1,\ b_7=1, \qquad \text{Eqn. (15)}$$

and the remainder bits are:

$$r_0=1,\ r_1=0,\ r_2=0,\ r_3=1 \qquad \text{Eqn. (16)}$$

By examining the Non-Return to Zero (NRZ) bits, it is noted that only events number 1,3 and 6 in Table 1 could have occurred starting from bit $b_0$. Which of these three error events yield the remainder equal to Equation (16) are the determined. The remainders can be easily computed off line and stored in the following table:

TABLE 2

| Event # | Event | r0 | r1 | r2 | r3 |
|---|---|---|---|---|---|
| 1 | +1 | 1 | 0 | 0 | 0 |
| 2 | +1,−1,+1 | 1 | 1 | 1 | 0 |
| 3 | +1,−1 | 1 | 1 | 0 | 0 |
| 4 | +1,−1,+1,−1,+1 | 0 | 0 | 0 | 1 |
| 5 | +1,−1,+1,−1 | 1 | 1 | 1 | 1 |
| 6 | +1,0,0,+1 | 1 | 0 | 0 | 1 |
| 7 | +1,−1,+1,−1,+1,−1 | 0 | 1 | 1 | 0 |
| 8 | +1,0,+1 | 1 | 0 | 1 | 0 |
| 9 | +1,−1,+1,−1,+1,−1,+1 | 1 | 0 | 1 | 1 |
| 10 | +1,0,+1,0,+1 | 0 | 1 | 0 | 0 |
| 11 | +1,−1,+1,0,0,+1 | 1 | 0 | 0 | 1 |

Among events 1, 3 and 6, only event number 6 will have the remainder bits equal to Equation (16). Hence the MLDP need only be computed for event number 6.

The process of determining error event feasibility for j=1, j=2, etc., follows Meggitt decoder, as reported in the literature. For j=1, the updated remainder $r^{(1)}(x)$ is computed, which is equal to remainder after division of xr(x) by g(x):

$$r^{(1)}(x)=\text{Remainder}[xr(x),\ g(x)] \qquad \text{Eqn. (17)}$$

Then in order to determine which error events beginning at bit b1 would agree with the remainder information, the same Table 2 can be used, but with $r_0^{(1)}, r_1^{(1)}, r_2^{(1)}, r_3^{(1)}$ instead of $r_0, r_1, r_2, r_3$. For example, NRZ bits $b_1$ through $b_7$ indicate that only event number 1 with reversed sign (i.e. "−1") could have occurred. In order to determine if this event agrees with the remainder information, compute:

$$r^{(1)}(x)=\text{Remainder}[x+x^4,\ g(x)]=1+x^2 \qquad \text{Eqn. (18)}$$

The only event with such remainder in Table 2 is number 8 and therefore there are no feasible error events beginning at bit $b_1$.

Similarly, for position j, the remainder is updated:

$$r^{(j)}(x)=\text{Remainder}[xr^{(j-1)}(x),\ g(x)] \qquad \text{Eqn. (19)}$$

and Table 2 is used with $r_0^{(j)}, r_1^{(j)}, r_2^{(j)}, r_3^{(j)}$ instead of $r_0, r_1, r_2, r_3$.

Referring now to FIG. 4, the remainder bits computed in circuit 402 are sent to the remainder update circuit 410 where the remainder bits are continuously updated in accordance with Equation (19). At the same time, output from Viterbi algorithm 400, appropriately delayed 406, is used in NRZ bit event check 430 to rule out error event which do not agree with the NRZ bits. Table 2 is implemented in the remainder decode circuit 428 where the updated remainder bits from the remainder update circuit 410 are used to rule out error events which are not consistent with the remainder information.

The post-processor of FIG. 4 corrects for feasible errors by a process that begins with reconstructing the noiseless samples from Viterbi output that are within the channel 408, and with subtracting actual input samples appropriately delayed 414. The resulting error is then supplied to a bank of 11 filters 416 which correlate the output with the 11 events in Table 2. Outputs of some of these filters are then disabled in circuit 418 if the signal coming from the remainder decode circuit 428 indicates that corresponding error events are not feasible. Outputs of some of other filters have their sign reversed. This happens when remainder decode circuit 428 sends information that the feasible error event (e.g. −1,0,0,−1) is sign-reversed from the event (e.g. event number 6 in Table 2) for which there is a filter in the bank 416. A set of different constants (offsets) is then added to the outputs in circuit 420 and the result is sent to the circuit 426 where the minimum is found and compared with the stored global (i.e. over all positions j) minimum. The outputs of the offset circuit 420 are the aforementioned MLDP for different error events. The new global minimum is then stored in global minimum storage 412 and the location j of the new minimum is stored in location storage 424. At the same time, storage 422 stores the type of error (number 1 through 11) that gave rise to the new global minimum. After post-processor is done with the current codeword, the location and the type of error are sent to the correction circuit 404 where the data is corrected.

The coefficients of filters in the bank of filters 416, and the values of additive constants in the offset circuit 420 are determined according to the following considerations. In many existing magnetic recording systems the equalized channel response has memory of four:

$$h(D) = h_0 + h_1 D + h_2 D^2 + h_3 D^3 + h_4 D^4 \quad \text{Eqn. (20)}$$

Denote the noisy received samples at the output of delay 414 by $r_j$. Then the input to the bank of filters 416 is given by equation:

$$s_i = \sum_{k=0}^{k=4} b_{i-k} h_k - r_i \quad \text{Eqn. (21)}$$

The summation:

$$\sum_i (s_i)^2 \quad \text{Eqn. (22)}$$

is called Maximum Likelihood Distance (MLD) and it is precisely the quantity that Viterbi algorithm 400 minimizes by recursing through different possible data sequences b. However Viterbi algorithm 400 has no knowledge of the cyclic code and therefore chooses the sequence $b=(b_0, b_1, \ldots, b_{68})$, with the smallest sum by Equation (22) without assuring that it is a valid cyclic codeword. Trying to correct for a cyclic code error can only increase the summation by Equation (22) and the amount of increase is referred to as Maximum Likelihood Distance Penalty (MLDP). To facilitate Maximum Likelihood detection of the cyclicly encoded data, the post-processor must find the error event which will correct the remainder and which will have the smallest MLDP. For error event $e=(0, \ldots, 0, e_j, e_{j+1}, e_{j+2}, e_{j+3}, e_{j+4}, e_{j+5}, e_{j+6}, 0, \ldots, 0)$ with starting location j, the MLDP can be computed as follows:

$$\sum_i \left(s_i - \sum_k e_{i-k} h_k\right)^2 - \sum_i s_i^2 = \quad \text{Eqn. (23)}$$

$$\sum_i \left(\sum_k e_{i-k} h_k\right)^2 - 2 \sum_i s_i \left(\sum_k e_{i-k} h_k\right)$$

The first term in the right hand side of Equation 23 is the offset added in offset circuit 420. The offset does not depend on sequence $s_j$ but only on the type of error event. For example, for event number 6 in Table 2, the offset is equal to:

$$\sum_i \left(\sum_k e_{i-k} h_k\right)^2 = (h_0)^2 + (h_1)^2 + (h_2)^2 + \quad \text{Eqn. (24)}$$

$$(h_3 + h_0)^2 + (h_4 + h_1)^2 + (h_2)^2 + (h_3)^2 + (h_4)^2$$

The offsets for other error events can be computed in a similar way. The second term in Equation (23) represents the result of filtering of input si coming into the bank of filters 416 in FIG. 4. For example, the filter for error event number 6 in Table 2 has eight taps equal to:

$$-2h_4 \ -2h_3 \ -2h_2 \ -2(h_4+h_1) \ -2(h_3+h_0) \ -2h_2 \ -2h_1 \ -2h_0$$

The filter taps for other error events can be computed in a similar manner.

After corrections are made in correction circuit 404 of FIG. 4, the data thus produced by the post-processor is supplied to the precode and modulation code decoder 510 of FIG. 5. The bits are first applied to the precode decoder which has the transfer function $1 \oplus D^2$ and then to the 64/65 RLL code decoder in the circuit 510.

Figure 7:
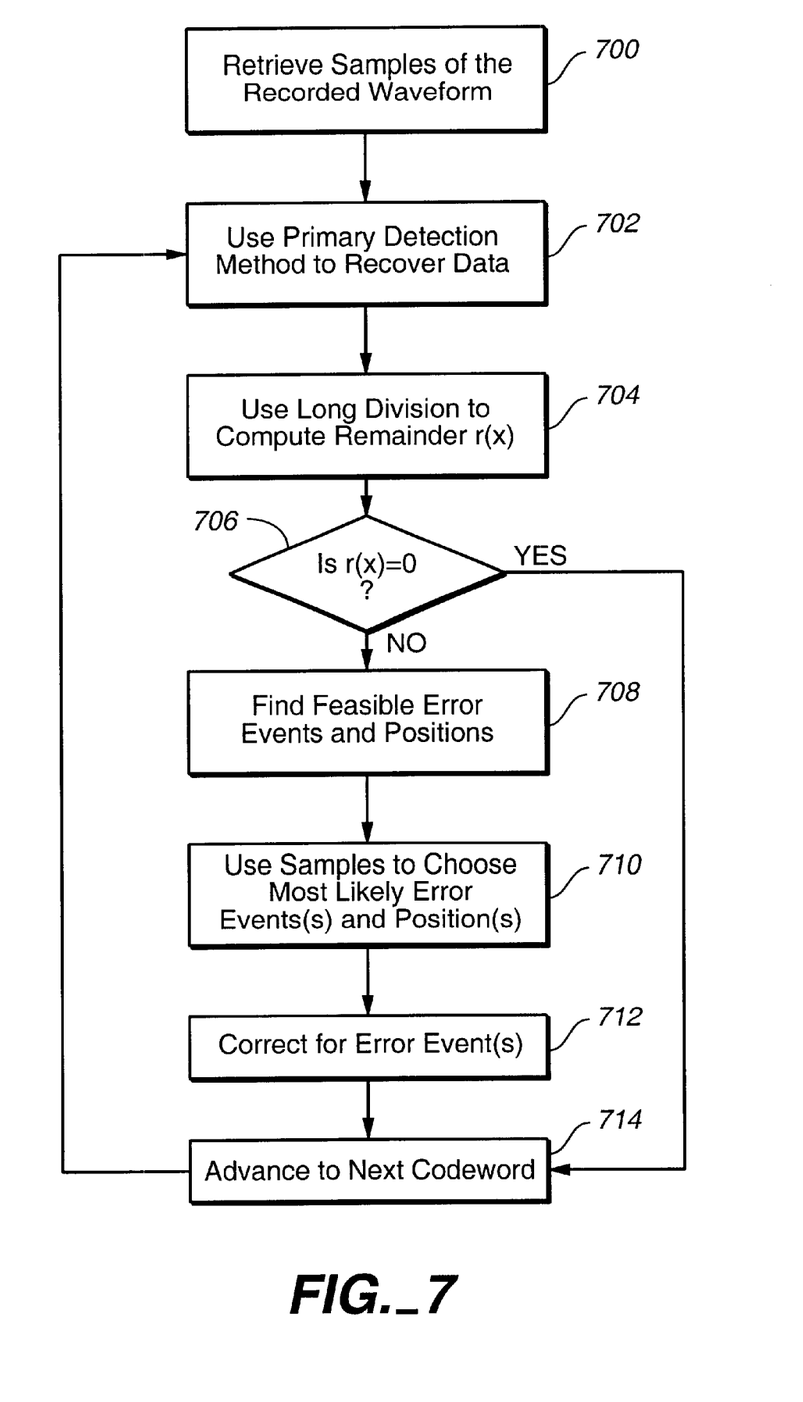
FIG. 7 is a flow chart illustrating operation of the post processor according to the present invention.

The flowchart illustrating the method of the present invention is shown on FIG. 7. The data is presumed to have been encoded with a cyclic code prior to being written on a media. Samples of the recorded waveform are retrieved 700. These samples are used to recover the binary data 702 using the primary detection method. For example, the Viterbi algorithm may be used as such primary detection method. The primary method produces a sequence of data which is mostly correct and where only occasional data correction is needed to further reduce the bit error rate. A remainder r(x) after division by the generator polynomial g(x) is computed 704 for a cyclic code codeword recovered using a method of long division. The remainder is checked 706 for equal to zero. Here polynomial r(x) is said to be equal to zero if all its coefficients $r_0, r_1, \ldots, r_m$ are equal to zero. If the remainder is not equal to zero, then the cyclic codeword is not valid and corrections must be made. So if the response to the inquiry 706 is No, then the process proceeds to find feasible error events and positions 708. If the answer is Yes, then the process advances to the next codeword, since the current codeword does not require corrections. In finding feasible errors and positions (or, locations) 708, a determination is made of which error events (from a predetermined collection of dominant error events) and at what locations in the codeword, consistent with the remainder r(x) and with the recovered data sequence. The latter is needed since many dominant error events occur when locations of several consecutive transitions in the recorded waveform are determined incorrectly and hence if the recovered data sequence indicates no transitions, this would not be possible. After all feasible error events (from a predetermined collection of dominant error events) and positions are found, samples of the recorded waveform are used to choose the most likely error event(s) and location(s) among error event(s) and location(s) which were found feasible in step 708. Note that more than a single error event may be corrected in a codeword. Then, correction 712 for the chosen error event(s) is performed. Finally, the process advances 714 to the next codeword and the whole process repeats starting from step 702.

It should be noted that a parity code, when a parity bit is added to a codeword, can be viewed as a cyclic code with generator polynomial g(x)=x+1. Similarly, a double-parity code when two parity bits are appended to assure that the sum of odd-numbered bits is even and the sum of even-numbered bits is even can be viewed as a cyclic code with generator polynomial $g(x)=x^2+1$. However the process of summing up bits to determine the values of parities is different from the recursive process of long division according to the present invention.

Another distinct feature of this invention is that step 708 (to determine which events/positions are feasible) is executed prior to executing step 710 (use samples to choose most likely events/positions). This facilitates use of more efficient circuitry than may be used to implement conventional processes. Thus, a cyclic code post processor 508 in the read channel of FIG. 5, and a cyclic code encoder 602 in the write channel provide improved operation over conventional read and write channels resulting from the calculation and insertion (or retrieval) of codewords according to the present invention

What is claimed is:

1. A method for receiving data grouped into cyclic code codewords and consecutively correcting at least one error event in a preselected collection of error events the method comprising:

receiving samples carrying the data;

recovering data sequence from the received samples;

performing an arithmetic operation on the recovered data sequence using the cyclic code of each codeword to calculate any remainders resulting from the arithmetic operation on the recovered data sequence;

characterizing as an error event a remainder different from a selected value;

determining for each error event in the preselected collection of error events the positions in the recovered data sequence at which the occurrence of each error event is consistent with the remainders resulting from the arithmetic operation on the recovered data sequence;

for every codeword for which the remainder is different from the selected value, selecting at least one error event and at least one position from among error events and positions in the preselected collection of error events determined to be consistent with the recovered data sequence and the remainder using the received samples; and for every codeword for which the remainder is different from the selected value, correcting for at least one error event for at least one position selected in the previous step.

2. The method according to claim 1 in which the arithmetic operation is division and an error event is equal to zero.

3. Apparatus for correcting error events on received data grouped into cyclic code codewords and consecutively correcting at least one error event in a stored preselected collection of error events, the apparatus comprising:

a circuit for digitizing the received data;

a detector to receive the digitized received data for recovering data sequences from the digitized received data;

a logic circuit connected to receive the recovered data sequences for performing an arithmetic operation on the recovered data sequence using the cycle code of each codeword for calculating any remainders resulting from the arithmetic operation on the recovered data sequence;

a sensor connected to respond to any remainder from the logic circuit that is different from a selected value for indicating an error event;

a structure responsive to each error event for determining from the preselected collection of error events the position in the recovered data sequence at which the occurrence of each error event is consistent with the remainder calculated in the logic circuit;

circuitry connected to respond to remainders different from the selecter value for selecting for every codeword at least one error event and at least one position from among the stored preselected collection of error events which are consistent with the recovered data sequence and the remainder using the digital received data, the circuitry correcting the recovered data sequence for at least the one error event and at least the one position.

4. Apparatus as in claim 3 in which the logic circuit performs division using the cycle code, and the sensor responds to remainders not equal to zero to provide the indication of an error event and the circuitry corrects the error event and position in the recovered data sequence in response to the selection of the error event and position from the stored preselected collection of error events to provide zero remainder from the division operation of the logic circuit upon the corrected data sequence.

5. The apparatus according to claim 3 wherein the detector is a Viterbi detector.

6. Apparatus for correcting error events on received data grouped into cyclic code codewords and consecutively correcting at least one error event in a stored preselected collection of error events, the apparatus comprising:

a detector to recover data sequences from the received data to provide recovered data;

a remainder circuit to perform an arithmetic operation on the recovered data using the cyclic code of each codeword for calculating any remainders resulting from the arithmetic operation on the recovered data to provide remainder information;

a remainder decode circuit to determine, if any error events are inconsistent, the remainder information to provide an inconsistent error event list;

a determining circuit to determine a set of error events from the received data;

a decoding circuit
to determine which a most likely error event from the set of error events and which is not on the inconsistent error event list, and
to output the most likely error, and
to determine a position in the recovered data of the most likely error event; and an error correction circuit to correct the recovered data if a remainder of the recovered data calculated by the remainder circuit is different from the selected value in accordance with the most likely error event at the position of the most likely error event determined by the decoding circuit.

7. Apparatus as in claim 6 in which the remainder circuit performs division using the cycle code, and the determining circuit responds to remainders not equal to zero to provide the indication of an error event and the error correction circuit corrects the error event and position in the recovered data in response to the selection of the error event and position from the stored preselected collection of error events to provide zero remainder from the division operation of the remainder circuit upon the corrected data sequence.

8. The apparatus according to claim 7 wherein the detector is a Viterbi detector.

9. Apparatus for correcting error events on received data grouped into cyclic code codewords and consecutively correcting at least one error event in a stored preselected collection of error events, the apparatus comprising:

digitizing means for digitizing the received data;

detector means connected for receiving the digitized received data and for recovering data sequences from the digitized received data;

logic means connected for receiving the recovered data sequences and for performing an arithmetic operation on the recovered data sequence using the cycle code of each codeword for calculating any remainders resulting from the arithmetic operation on the recovered data sequences;

sensor means connected for responding to any remainder from the logic means that is different from a selected value for indicating an error event;

determining means responsive to each error event for determining from the preselected collection of error events the position in the recovered data sequence at which the occurrence of each error event is consistent with the remainder calculated in the logic means;

selecting means connected to respond to remainders different from the selected value for selecting for every codeword at least one error event and at least one position from among the stored preselected collection of error events which are consistent with the recovered data sequence and the remainder using the digitalized received data, the selecting means correcting the recovered data sequence for at least the one error event and at least the one position.

10. Apparatus as in claim 9 in which the logic means performs division using the cycle code, and the sensor means responds to remainders not equal to zero to provide the indication of an error event and the selecting means corrects the error event and position in the recovered data sequence in response to the selection of the error event and position from the stored preselection collection of error events to provide zero remainder from the division operation of the logic means upon the corrected data sequence.

11. The apparatus according to claim 9 wherein the detector means is a Viterbi detector means.

12. Apparatus for correcting error events on received data grouped into cyclic code codewords and consecutively correcting at least one error event in a stored preselected collection of error events, the apparatus comprising:

detector means for recovering data sequences from the received data to provide recovered data;

remainder means for performing an arithmetic operation on the recovered data using the cycle code of each codeword for calculating any remainders resulting from the arithmetic operation on the recovered data to provide remainder information;

remainder decode means for determining, if any error events are inconsistent, the remainder information to provide an inconsistent error event list;

determining means for determining a set of error events from the received data;

decoding means
for determining which a most likely error event from the set of error events and which is not on the inconsistent error list, and
for outputting the most likely error, and
for determining a position in the recovered data of the most likely error event; and error correction means for correcting the recovered data if a remainder of the recovered data calculated by the remainder means is different from the selected value in accordance with the most likely error event at the position of the most likely error event determined by the decoding means.

13. Apparatus as in claim 12 in which the remainder means performs division using the cycle code, and the determining means responds to remainders not equal to zero to provide the indication of an error event and the error correction means corrects the error event and position in the recovered data in response to the selection of the error event and position from the stored preselected collection of error events to provide zero remainder from the division operation of the remainder means upon the corrected data sequence.

14. The apparatus according to claim 13 wherein the detector means is a Viterbi detector means.

15. A method for receiving data grouped into cyclic code codewords and consecutively correcting at least one error event in a preselected collection of error events the method comprising:

(a) recovering data sequences from the received data to provide recovered data;

(b) preforming an arithmetic operation on the recovered data using the cycle code of each codeword for calculating any remainders resulting from the arithmetic operation on the recovered data to provide remainder information;

(c) determining if any error events are inconsistent, the remainder information to provide an inconsistent error event list;

(d) determining a set of error events from the received data;

(e) determining which a most likely error event from the set of error events and which is not on the inconsistent error event list, and (f) outputting the most likely error, (g) determining a position in the recovered data of the most likely error event; and (h) correcting the recovered data if a remainder of the recovered data calculated by step (b) is different from the selected value in accordance with the most likely erroe event at the position of the most likely error event determined by step (g).

* * * * *